United States Patent [19]

Dressler

[11] 4,327,446
[45] Apr. 27, 1982

[54] NOISE BLANKER WHICH TRACKS AVERAGE NOISE LEVEL

[75] Inventor: Roger W. Dressler, Palatine, Ill.

[73] Assignee: Motorola, Inc., Schaumburg, Ill.

[21] Appl. No.: 177,341

[22] Filed: Aug. 12, 1980

Related U.S. Application Data

[63] Continuation of Ser. No. 32,625, Apr. 23, 1979, abandoned.

[51] Int. Cl.³ .............................................. H04B 1/10
[52] U.S. Cl. .................................................... 455/223
[58] Field of Search ................. 455/212, 219, 222–224

[56] References Cited

U.S. PATENT DOCUMENTS

| | | |
|---|---|---|
| 3,098,872 | 7/1963 | Howard . |
| 3,188,571 | 6/1965 | Michael .............................. 455/222 |
| 3,191,124 | 6/1965 | Brown ................................. 455/224 |
| 3,588,705 | 6/1971 | Paine . |
| 3,623,144 | 11/1971 | Fischel . |
| 3,699,457 | 10/1972 | Wright ................................ 455/224 |
| 3,739,285 | 6/1973 | Hepp . |
| 4,006,419 | 2/1977 | Liman . |
| 4,189,679 | 4/1981 | Amazawa et al. . |

FOREIGN PATENT DOCUMENTS

| | | |
|---|---|---|
| 2633000 | 1/1978 | Fed. Rep. of Germany . |
| 2370391 | 11/1977 | France . |

OTHER PUBLICATIONS

"A Simple Noise Blanker", Electronics Australia, vol. 38, No. 11, Feb. 1977.
1979 Sanyo Paris Catalog of Sanyo Part. No. LA 2101, Printed Nov. 1978.
1978 Sanyo Catalog Listing for Integrated Circuit LA 2100.
"Stereo-Autoempfänger mit eingebautem Kassettenteil", Funkschau, 8/19/76, pp. 42–45 by Riethergen.
"Impulsive Noise Reduction In Radio Receivers", by Gosling, 5/73, pp. 341–347.

*Primary Examiner*—Jin F. Ng
*Attorney, Agent, or Firm*—James W. Gillman; Phillip H. Melamed

[57] ABSTRACT

A noise blanker which has circuitry that enables the threshold level of noise blanking to track the average background noise level is disclosed. In general, a controllable gate receives an input signal and selectively passes and blocks the input signal in response to received noise blanking pulses which are generated in response to high peak magnitude noise impulses. A signal related to background and impulse noise is extracted from an input signal. A controllable gain noise amplifier is utilized to amplify the separated background and impulse noise and negative feedback circuitry is utilized to maintain the average peak output of the noise amplifier substantially constant except for occasional large magnitude noise impulses which do not substantially change the average peak magnitude of the background and impulse noise. The output of the controllable noise amplifier is applied to a threshold switch means which produces blanking pulses in response to the amplified noise signal having a peak exceeding a magnitude which is greater than the substantially constant peak output level of the noise amplifier. This results in a blanker circuit in which the threshold level of blanking pulses closely tracks the average peak value of the background and impulse noise.

12 Claims, 4 Drawing Figures

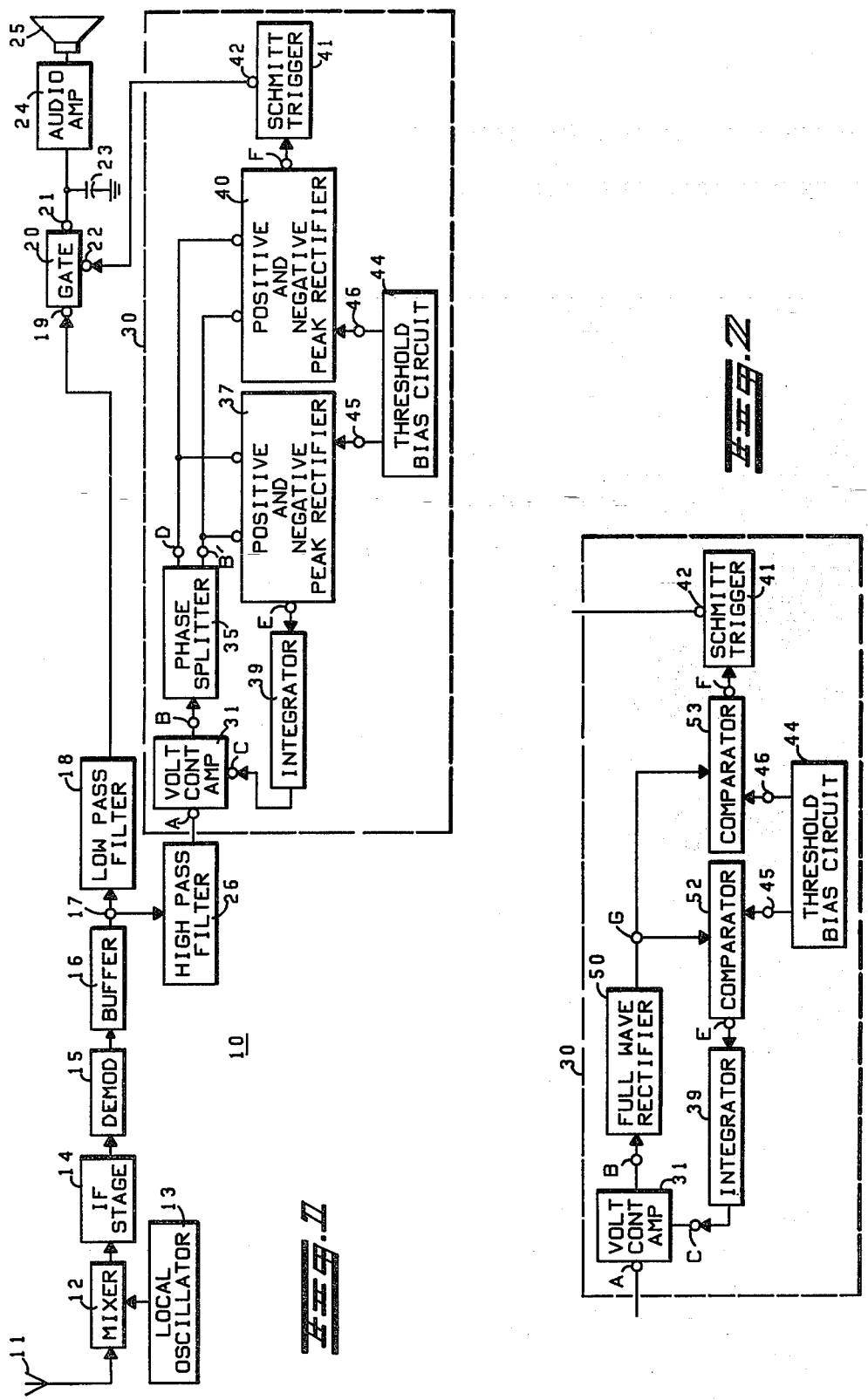

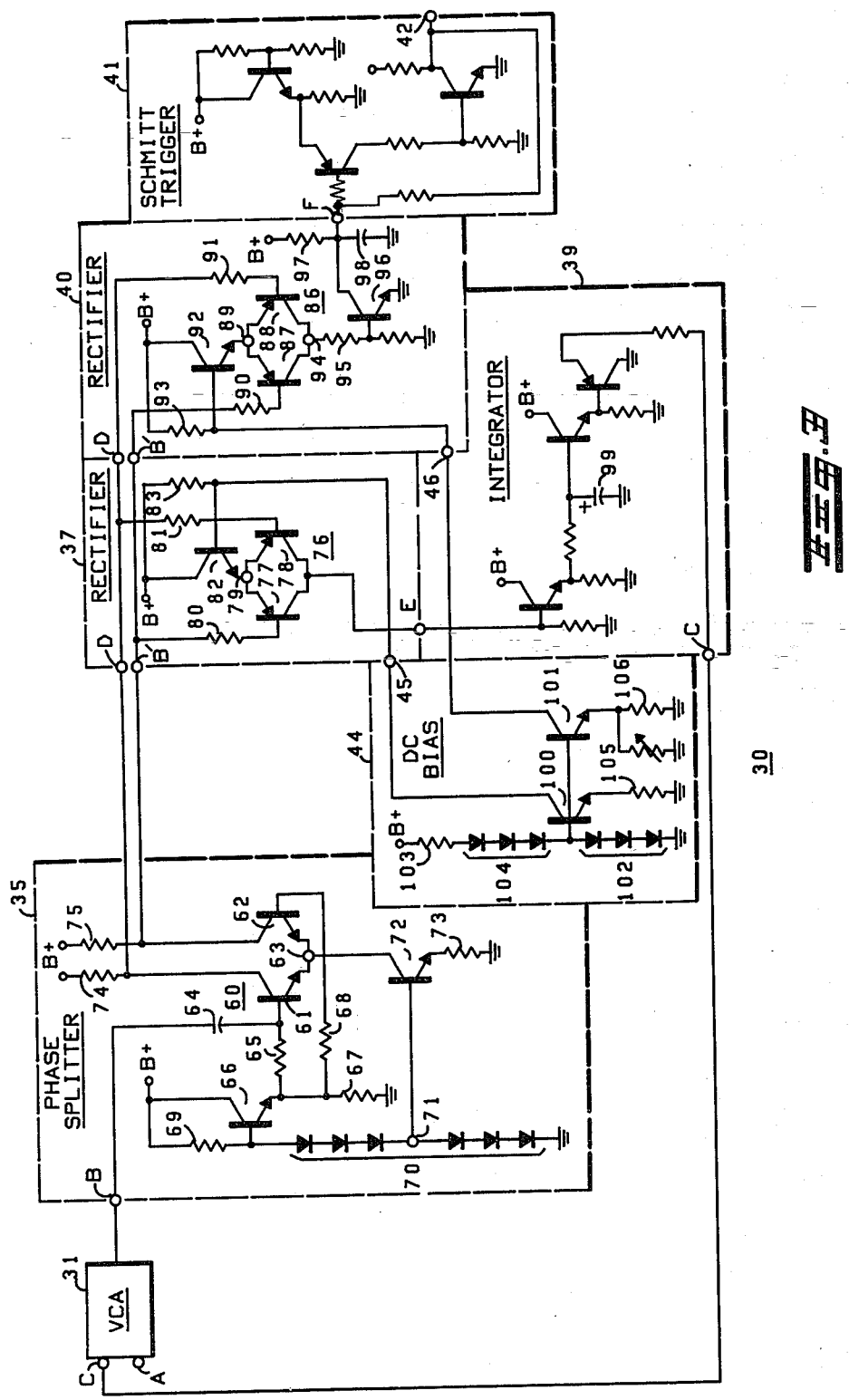

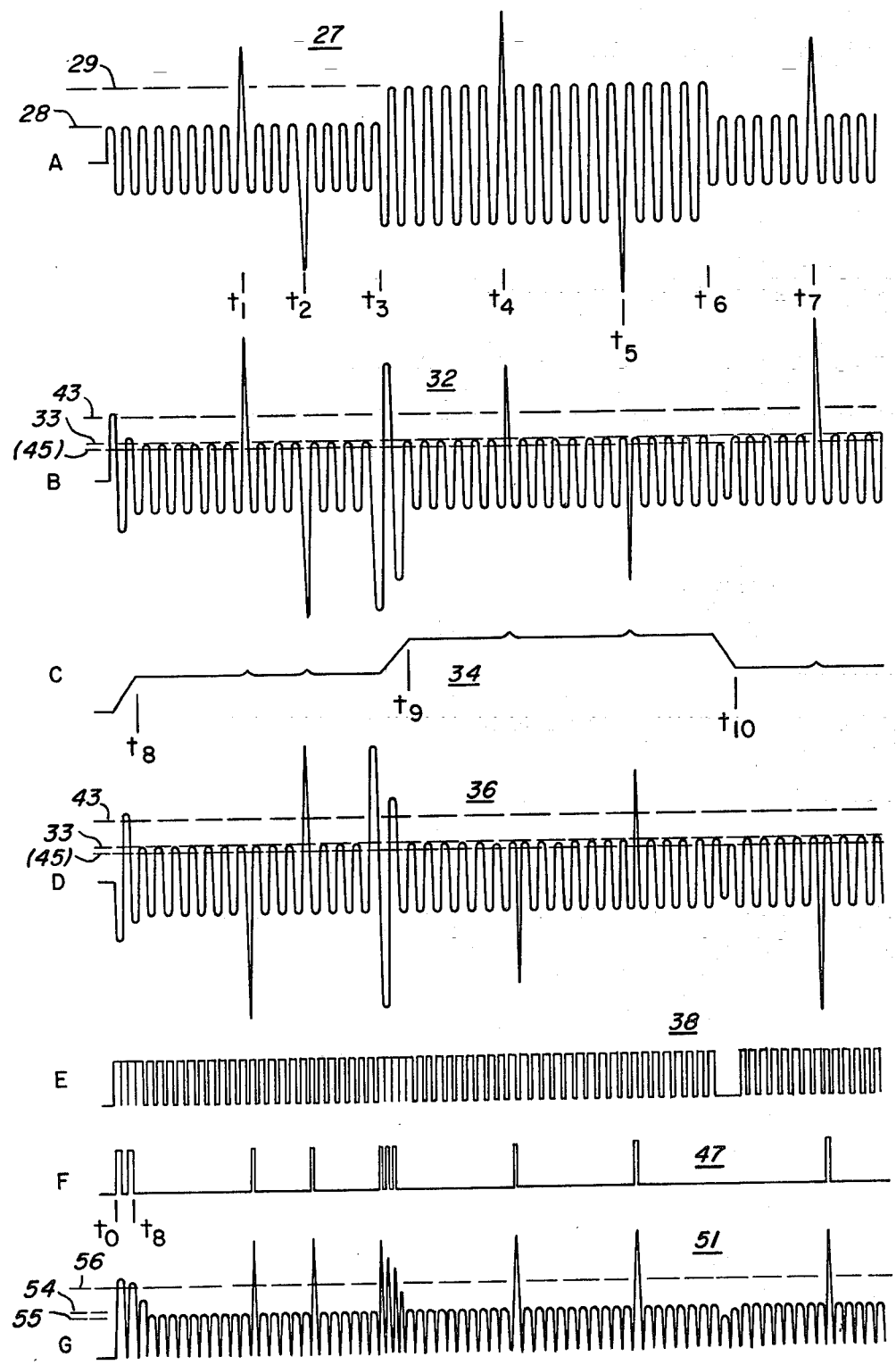

NOISE BLANKER WHICH TRACKS AVERAGE NOISE LEVEL

This is a continuation of application Ser. No. 032,625, filed Apr. 23, 1979, now abandoned.

BACKGROUND OF THE INVENTION

The present invention generally relates to the field of noise blanker circuits for selectively blocking the passage of a received signal in response to large magnitude noise impulses. More particularly, the present invention relates to the use of such a noise blanker circuits in a radio receiver.

Noise blanking circuits used in radio receivers generally receive an information containing background noise and noise impulses (abrupt noise spikes) superimposed upon it. The prior art blanking circuits then selectively prevent the passage of the composite signal containing the information signal, background noise and noise impulses by determining when the noise impulses have exceeded some predetermined threshold level. Some prior art noise blanking circuits utilize a controllable gate followed by a holding capacitor, with the controllable gate being controlled in accordance with noise blanking pulses. The blanking pulses selectively pass and block the information signal and superimposed noise in response to noise impulses, with the holding capacitor maintaining the output of the controllable gate constant during the duration of the noise blanking pulses. Some noise blanking circuits also utilize blanking rate shut off circuitry in which the operation of the noise blanker is suspended, or materially reduced, whenever the blanking rate produced in response to rapidly occurring large magnitude noise impulses is so high that continued noise blanking would severely disrupt the quality of the signal passed by the noise blanking pulse controlled gate.

The majority of the prior art noise blanking circuits merely initiate blanking whenever a received noise impulse is detected as having a magnitude exceeding a fixed predetermined threshold level. This is undesirable since there are many times when blanking is desired only for noise impulses which just marginaly exceed the peak noise level of the background noise contained in a received signal. By utilizing a fixed threshold level, the prior art noise blankers either fail to produce any significant blanking for small peak magnitude noise impulses or misinterpret the high background noise level as a series of rapid noise impulses and produce too much blanking thereby degrading the quality of the information signal passed by the controllable gate.

Some prior art blanker circuits have attempted to alter the noise blanking threshold in accordance with the background noise level. However, these blanker circuits, one of which is illustrated in U.S. Pat. No. 4,006,419, have been found not to readily lend themselves to implementation on integrated circuits, and have also been found to be deficient in that the threshold level at which blanking occurs cannot be made to sufficiently closely track the average peak noise level of the background noise contained in an input signal. As a result of this, prior art noise blankers have not been able to initiate blanking for noise impulses which occur at levels slightly above the average peak background noise level because their circuitry did not permit the blanking threshold level to closely track the average peak background noise level as a function of its magnitude variation and in view of expected temperature variations.

In addition, most prior art noise blanking circuits required additional circuitry in order to implement a rate shut off feature which prevented blanking whenever a high repetition rate of impulses noise was encountered. Most of these blankers severely degraded the signal quality of the signal passed by these blankers when such a condition occurred, since the rate shut-off was implemented by sensing when too much blanking had already occurred.

SUMMARY OF THE PRESENT INVENTION

An object of the present invention is to provide an improved noise blanker which overcomes all of the aforementioned deficiencies.

A more specific object of the present invention is to provide a noise blanker circuit in which the occurrence of noise blanking can be set and will closely track the average peak magnitude of background noise.

In one embodiment of the present invention a noise blanker circuit for eliminating impulse noise in a received information signal is provided. The noise blanker circuit comprises: terminal means for receiving an input signal comprising an information signal which is accompanied by background noise and noise impulses; noise detection means coupled to said terminal means for receiving said input signal and producing a noise detect signal related to said background noise and noise impulses but substantially independent of said information signal; blanking pulse generating means coupled to said noise detection means for receiving said noise detect signal and producing noise blanking pulses in response thereto; and controllable gate means coupled to said blanking pulse generating means and said terminal means for receiving said input signal and said noise blanking pulses and selectively passing and blocking said input signal in response to said noise blanking pulses; wherein the improvement comprises said blanking pulse generating means including in combination: noise amplifier means for receiving said noise detect signal and producing at an output terminal an amplified noise output signal in response to said noise detect signal, the amplified output signal having peak magnitudes being substantially maintained at a first predetermined level by controlling the gain of said noise amplifier means in accordance with the average peak magnitudes of said noise detect signal; and threshold switch means for receiving and amplified noise output signal and producing said blanking pulses in response to said amplified noise output signal exceeding a second predetermined level greater in absolute magnitude than said first predetermined level; whereby occasional large magnitude noise impulses which do not substantially change the average peak magnitude of said noise detect signal will result in blanking pulses since the gain of the noise amplifier means will not be substantially changed in response to these large magnitude noise impulses.

Essentially, the noise amplifier means utilizes negative feedback circuitry in a gain control loop to provide an amplified noise output signal which has its peak magnitudes being maintained at a substantially constant first level. The negative feedback circuitry comprises a rectifier means which receives an input from the noise amplifier output and which is followed by an integrator means which produces a DC control voltage for controlling the variable gain noise amplifier. The output of the noise amplifier is utilized as an input to a fixed threshold switching device, and the actual switching level of the device (which generates the noise blanking pulses) is set at a predetermined offset level above the average peak level of the amplified background noise. This offset setting is maintained as the average background noise peak level varies.

In addition, the rectifier means in the negative feedback circuitry is contemplated as producing a constant magnitude output signal as its output which is supplied to the integrator means. This will result in minimizing the effect of extremely large magnitude but short duration noise impulses on the DC gain control signal which implements the substantially constant magnitude peak level of the output of the noise amplifier. The end result is that large magnitude, short duration noise impulses will not disturb the operation of the present circuit by distorting the DC control voltage, but will still result in the proper generation of a noise blanking pulse. Thus the susceptibility of the present invention to extremely large magnitude noise impulses disrupting its operation has been reduced.

BRIEF DESCRIPTION OF THE DRAWINGS

For a more complete understanding of the present invention, reference should be made to the drawings, in which:

FIG. 1 is a block diagram of a radio receiver utilizing a noise blanker circuit constructed according to the teachings of the present invention;

FIG. 2 illustrates a block diagram of an alternate embodiment for the noise blanker circuit illustrated in FIG. 1;

FIG. 3 is a detailed schematic diagram of components of the noise blanker circuit illustrated in FIG. 1; and FIGS. 4A through G are a series of graphs representing typical waveforms of signals produced by the noise blanker circuits illustrated in FIGS. 1 through 3.

DESCRIPTION OF THE PREFERRED EMBODIMENT

Referring to FIG. 1, an FM radio receiver 10 is illustrated which includes noise blanker circuitry. The receiver compromises an antenna 11 which feeds a mixer stage 12 that receives another input from a local oscillator 13 and supplies an output to an IF stage 14. The IF stage is coupled to and supplies an input to a demodulator 15 whose output is processed by a buffer amplifier 16 which supplies an input signal to an input terminal 17.

The input signal produced at the terminal 17 essentially comprises a received audio information signal, of an undecoded stereo signal, having receiver background noise and impulse noise superimposed upon this information signal. The background noise is due to the inherent operation of the radio receiver components 11 through 16, whereas the impulse noise comprises noise spikes which are generally received along with signal radiations by the antenna 11. Both the background noise and noise impulses tend to degrade the quality of the information signal present at the terminal 17, and the present invention concerns utilization of blanker circuitry to improve the quality of the signal produced at the terminal 17.

The operation of the components 11 through 16 is extremely well known and therefore will not be discussed any further. It should be noted that the radio receiver 10 is preferably an FM radio receiver.

The terminal 17 is coupled through a low pass filter 18 to an input terminal 19 of a controllable gate 20 having an output terminal 21 and a control terminal 22. The gate output terminal 21 is coupled to ground through a holding capacitor 23 and is coupled through an audio amplifier 24 to a speaker 25. It is contemplated that the audio amplifier 24 may include stereo decoder means for providing right and left channel separation when the information signal at the terminal 17 is the result of FM stereo reception.

The low pass filter 18 is intended to essentially pass frequencies below 70 kHz to the gate 20 and to provide a predetermined time delay for signals reaching the gate terminal 19. This insures that the gate 20 will receive any audio, stereo carrier sideband signals produced at the terminal 17. The function of the gate 20 is to selectively pass and block the output of the low pass filter 18 such that only when a low control voltage is present at the terminal 22 will the terminals 19 and 21 be shorted together, whereas when a high voltage is present at the control terminal 22 an open circuit exists between the terminals 19 and 21. The holding capacitor 23 maintains the signal at the terminal 21 at its last previous magnitude during the existence of a high voltage at the control terminal 22. In this manner the signal output of the gate 20 is maintained at a substantially constant magnitude during the existence of blanking pulses produced at the terminal 22, whereas at other times the signal at the termimal 21 merely follows the signal at the terminal 19. The components 11 through 25 are generally found in prior art noise blanker circuits.

The present invention include a noise detection means comprising a high pass filter 26. This high pass filter is coupled to the terminal 17 which supplies an input to the filter 26, and the filter output is provided at a terminal A. The high pass filter 26 is intended to pass only frequencies above 90 kHz. In this manner, information signals present at the terminal 17 will be blocked by the high pass filter 26, whereas the signal produced at the terminal A will represent the background noise level of the signal at the terminal 17 plus any noise impulses. This is true because background noise is essentially equally distributed throughout the frequency band for the signal at the terminal 17. The same holds true of impulse noise, which if anything has a more pronounced effect at high frequencies.

The high pass filter 26 produces a noise detect signal 27 at the terminal A which is directly related to the background noise and impulse noise present at the terminal 17, but is substantially independent of any information signal present at the terminal 17. The noise detect signal 27 at the terminal A is schematically represented in FIG. 4A. It should be noted that the FIGS. 4A through 4G illustrate waveforms for signals produced by the present invention at terminals labeled A through G, respectively, shown in FIGS. 1, 2 and 3. The vertical axes of the waveforms in FIG. 4 correspond to amplitude, whereas the horizontal axes for these waveforms correspond to time.

In order to better understand the present invention, the shape of a hypothetical noise detect signal 27 at the terminal A will now be described with reference to waveform shown in FIG. 4A. It is assumed that prior to a time $t_0$ no signal is present at the terminal A. At the time $t_0$ until a subsequent $t_3$ a noise background signal having a relatively constant peak magnitude 28 is present at the terminal A. At the time $t_1$ and $t_2$ positive and negative noise impulses occur, respectively, which have substantially greater magnitudes than the average peak magnitude 28. At the subsequent time $t_3$ it is contemplated that the background noise level of the signal 27 at the terminal A will now increase to an average peak level 29 which is greater than the level 28. A times $t_4$ and $t_5$ positive and negative noise impulses, respectively, are superimposed upon the background noise level, and at a time $t_6$ the background noise level reverts to the previous average peak level of 28 with an additional positive noise impulse occurring at a time $t_7$. While the background noise of signal 27 shown in FIG. 4A is illustrated as a sine wave, obviously this would not be the case and the sine waveform has merely been utilized to demonstrate the operation of the present invention. Typically the noise background signal would be a random accumulation of very high frequency pulses of relatively low magnitude whereas the noise spikes occurring at the times $t_1$, $t_2$, $t_4$, $t_5$ and $t_7$ would correspond to very large magnitude randomly occurring noise impulses. The object of the present invention is to provide for blanking the noise impulses at a level which effectively tracks the average peak magnitude levels of 28 and 29 of the background noise. Thus blanking can occur for noise impulses which just barely exceed the levels 28 and 29.

Basically, the present invention deals with the specific embodiment of a blanking pulse generating means 30 (shown dashed) which is coupled between the high pass filter 26 and the control terminal 22. Essentially the blanking pulse generating means 30 receives the noise detect signal 27 produced at the terminal A and produces corresponding noise blanking pulses in response thereto.

The blanking pulse generating means 30 in FIG. 1 comprises a voltage controlled noise amplifier 31 having an input corresponding to the terminal A, an output terminal at a terminal B and a control terminal at a terminal C. The amplifier 31 receives the noise detect signal at the terminal A and produces an amplified noise output signal 32 at the terminal B in response thereto. Essentially the signal 32 (shown in FIG. 4B) has peak magnitudes which are substantially maintained constant at a first predetermined level 33 by controlling the gain of the noise amplifier 31 in accordance with a DC control signal 34 provided at the terminal C. This DC control signal is essentially determined by the average peak magnitudes of the noise detect signal 27, and the manner in which this is accomplished will be subsequently discussed in detail.

The terminal B serves as an input to a phase splitter 35. The function of the phase splitter is to provide two complementary phase signals at plus and minus output terminals B' and D in response to the signal at the input terminal B. Thus, in essence, the phase splitter 35 provides at its positive output terminal B' the same signal present at its input terminal B, while an inverted signal 36 is provided at its output terminal D. The positive output terminal of the phase splitter 35 has been identified as B' and the signal at this terminal is identical to the signal 32 produced at the terminal B, whereas the complementary phase signal 36 is provided at the terminal D.

The terminals D and B' are connected as inputs to a first positive and negative peak rectifier 37 which essentially rectifies the signals 32 and 36 and provides a constant amplitude output signal 38 at a terminal E in response thereto. The terminal E is connected as an input to an integrator 39 which integrates the rectified noise output signal 38 in order to produce the DC control signal 34 present at the terminal C.

Essentially, the components 35, 37 and 39 comprise negative feedback circuitry for the voltage controlled noise amplifier 31 in which the rectification of the positive and negative peaks of the output of the amplifier 31 is utilized by the integrator 39 to provide a control signal which maintains the average peak magnitude of the output signal 32 at the substantially constant predetermined level 33. The waveforms 4A through 4E illustrate the operation of the aforementioned components in response to the waveform 27 being received at the terminal A of the voltage controlled amplifier 31. It is clear that for the large magnitude noise impulses occurring at the times $t_1$, $t_2$, $t_4$, $t_5$ and $t_7$ the average peak magnitude of the signal 27 is not substantially affected due to the short duration of these pulses. Thus the present invention does not contemplate altering the level 33 in response to these pulses. The significance of this fact will become apparent subsequently.

The terminals D and B' are also connected as inputs to a second positive and negative peak rectifier 40 which produces an output at a terminal F that is connected as an input to a Schmitt trigger circuit 41 whose output, at a terminal 42, is directly connected to the control terminal 22 of the gate 20. The components 40 through 42 essentially form a threshold switching apparatus which receives the complementary phase amplified noise output signals at the terminals D and B' and produces blanking pulses, initially at the terminal F and subsequently at the terminal 42, in response to these amplified output signals (36 and 32) exceeding a predetermined threshold level 43 which is greater in absolute magnitude than the level 33 at which the average peaks of the noise output signal 32 are maintained at the terminal B. It should be noted that the phase splitter 35 need not provide amplification for the signals supplied to the terminals D or B'.

A threshold bias circuit 44 is provided in the blanking pulse generating means 30 and supplies a first DC bias voltage at a terminal 45 which is connected as an input to the first positive and negative peak rectifier 37 and a second DC voltage at a terminal 46 which is connected as an input to the positive and negative peak recitifier 40. The voltages at the terminals 45 and 46 essentially determine the levels 33 and 43, respectively, and thus it is contemplated that the magnitude of the voltage at the terminal 46 will have an absolute magnitude greater than the absolute magnitude of the voltage at the terminal 45.

FIG. 4F illustrates that the rectifier 40, in response to the voltage at the terminal 46 which determines the threshold level 43, essentially provides a noise blanking signal 47 which comprises blanking pulses of a constant magnitude for the duration of the times at which either the signal 32 or 36 exceeds the threshold level 43. In this manner, the present invention provides blanking for noise impulses which exceed the level 43. The effective blanking threshold for the present invention is made to track the average peak magnitude of the background noise signal, since the average peak magnitude of this signal has been normalized to the level 33 as shown in FIG. 4B. This is because the phase splitter 35, the rectifier 37 and the integrator 39 essentially maintain the peaks of the signal 32 such that the signal has a substantially constant average peak magnitude level which will not be affected by random large magnitude noise impulses of short duration. Thus essentially gain compensation is provided by the negative feedback circuitry of the present invention in response to the average peak level of the signal 27, and the effect of this gain on random noise impulses having larger than average magnitudes insures that these impulses will exceed the level 43 and result in the generation of blanking pulses.

Specific embodiments for the components 31 through 46 are illustrated in FIG. 3, and the operation of the specific structures shown therein will be described subsequently.

FIG. 2 illustrates an alternate embodiment for the blanking pulse generating means 10 shown in FIG. 1. Identical reference numbers and letters have been utilized to identify the structures in FIG. 2 which precisely correspond to structures in FIG. 1.

In FIG. 2, the output of the voltage controlled noise amplifier 31 at the terminal B is coupled as an input to a full wave rectifier 50 which produces an output signal 51 at a terminal G wherein the output signal 51 represents a full wave rectified version of the input signal 32. The terminal G is connected as an input to a DC level comparator 52 which produces an outout at the terminal E that is supplied as an input to the integrator 39 which supplies the control signal 34 to the control terminal C. Essentially the comparator 52 and full wave rectifier 50 replace the phase splitter 35 and rectifier 39 and produce the same output signal 38 at the terminal E which results in the application of the negative feedback DC signal 34 to the terminal C.

The terminal G is also coupled as an input to a comparator 53 which produces an output at the terminal F identical to the waveform 47. FIG. 2 illustrates the threshold bias circuit 44 suppling the DC voltages via the terminals 45 and 46 to the comparators 52 and 53, respectively, wherein the magnitude of the DC voltage of the terminal 46 is greater in absolute magnitude than the voltage supplied at the terminal 45. The terminal F is coupled as an input to the Schmitt trigger circuit 41 which supplies an output at the terminal 42 which is intended to be directly coupled to the control terminal 22 of the gate 20.

Essentially the full wave rectifier 50 produces the signal 51 at the terminal G and serves as an input to both of the comparators 52 and 53. The rectifier 50, comparator 52 and integrator 39 comprises negative feedback circuitry to produce the DC negative feedback signal 34 at the terminal C. The comparators 52 and 53 are essentially DC level comparators in which a signal is received at one input and is compared to a signal received at another input. When the polarity of one of the received signals changes with respect to the other received signal a change in the comparator output occurs. Since the full wave rectifier 50 and the DC comparators 52 and 53 are standard electronic devices they will not be described in any detail.

In the present case, the signal 51 (FIG. 4G) received at the terminal G has its average peak magnitude maintained a a substantially constant level 54 corresponding to the level 33 in FIG. 4B. The voltage at the terminal 45 essentially determines a threshold level 55 which is slightly below the level 54 in absolute magnitude. This results in the comparator 52 developing a constant amplitude output signal identical to the signal 38 in FIG. 4E. While the magnitude of the pulses of the signal 38 are a constant amplitude to prevent large magnitude noise impulses from disrupting the operation of the negative feedback circuitry, the time duration and/or number of pulses within a predetermined time period (density) of the signal 38 does vary such that the integrator 39 produces the signal 34 which results in maintaining the average peak magnitude of the signal 51 at the level 54. For the embodiment shown in FIGS. 1 and 3, the duration or density of the pulses of the signal 38 vary in an identical manner. The voltage at the terminal 46 determines a threshold level 56 which essentially corresponds to the level 43 in FIGS. 4B and 4D. The comparator 53 produces an output signal at the terminal F which is identical to the signal 47 in response to the waveform 51 exceeding the threshold level 56. Thus the circuitry in FIG. 2 merely represents an alternate embodiment for accomplishing the same end result as produced by the circuit in FIG. 1.

FIG. 3 will now be discussed with respect to how the circuitry shown therein realizes the components shown in the FIGS. 1 and 2.

The voltage controlled noise amplifier 31 is illustrated in block form since this component can be readily implemented by standard integrated circuit voltage controlled amplifiers such ad MC1550 or MC1590, both manufactured by Motorola, Inc., which are readily available and known to those of average skill in the art.

The phase splitter 35 essentially comprises a differential amplifier 60 comprising a pair of NPN transistors 61 and 62 having their emitters coupled together at a terminal and 62 having their emitters coupled together at a terminal 63. The base of transistor 61 receives an input through a capacitor 64 from the terminal B. Bias is supplied to the transistor 61 through a resistor 65 having one end directly coupled to the base of transistor 61 and another end coupled to the emitter on an NPN transistor 66. The emitter of transistor 66 is also coupled to ground through a resistor 67 and is coupled to the base of the transistor 62 through a resistor 68. The collector of transistor 66 is coupled to B+ and the base of this transistor is coupled to B+, through a resistor 69 while the base is also coupled to ground through six series connected diodes 70 connected in an anode to cathode configuration so as to form a current conducting path from the base of the transistor 66 to ground. A terminal 71 is midway between the series connection of the diode 70 and provides a three diode drop bias to the base of an NPN transistor 72 that has its emitter coupled to ground through a resistor 73 and its collector coupled to the terminal 63. The transistor 72 essentially forms a current source for the differential amplifier 60. Each of the collectors of the transistors 61 and 62 is separately coupled to B+ through resistors 74 and 75, respectively, and the collectors of the transistors 61 and 62 are directly connected to the terminals D and B', respectively.

The phase splitter 35 essentially functions to produce complementary output signals at the terminals D and B' wherein these signals have waveform corresponding to the signal waveform at the input terminal B, but the output at D and B' have opposite phase relationships, with the signal at terminal B' being identical in its waveform to the input signal at the terminal B.

The positive and negative peak rectifier 37 comprises a differential amplifier 76 consisting of a pair of PNP transistors 77 and 78 which have their emitters coupled together at a terminal 79 and their collectors directly connected to the terminal E. The bases of the transistors 77 and 78 are connected by resistors 80 and 81 to terminals B' and D, respectively. The terminal 79 is directly connected to the emitter of an NPN transistor 82 which serves as an emitter follower which biases the differential amplifier 76 and has its collector connected to B+, and its base connected to B+ through a resistor 83 and directly connected to the biasing terminal 45.

Essentially the rectifier 37 receives a bias potential at the terminal 45 which determines the conduction threshold of the differential amplifier 76 by determining the voltage at the terminal 79. In this manner, the rectifier 37 produces an output at the terminal E which represents a rectification of the positive and negative peaks of the waveforms received on the terminals D and B' with respect to the threshold level provided at the terminal 45. The transistors 77 and 78 are high gain devices which account for the constant amplitude of the output signal 38 produced at the terminal E, since this signal represents the saturation and cut off outputs of the transistors 77 and 78.

The rectifier 40 essentially consists of identical circuitry in that it also comprises a differential amplifier 86 comprising a pair of PNP transistors 87 and 88 having their emitters connected to a terminal 89, and the bases of the transistors 87 and 88 being connected through resistors 90 and 91 to the terminals B' and D, respectively. An NPN transistor 92 has its emitter directly connected to the terminal 89 and its collector directly connected to B'. The base of the transistor 92 is connected to B+ through a resistor 93 and directly connected to the threshold bias terminal 46. The operation of the components 86 through 93 of the rectifier 40 is identical to the operation of the components 76 through 83 of the rectifier 37, except that a higher threshold voltage is applied at the terminal 46 resulting in a higher switching threshold for the rectification produced by the rectifier 40.

The collectors of the transistors 87 and 88 are connected together at a terminal 94 which is connected to ground through a resistor divider 95 having its center tap connected to the base of an NPN transistor 96. The emitter of the transistor 96 is coupled to ground while the collector of the transistor is connected to B+ through a resistor 97, connected to ground through a capacitor 98 and directly connected to the output terminal F. In this manner the output of the rectifier 40 is inverted by the transistor 97 and supplied at the terminal F as an input to the Schmitt trigger circuit 41.

The detailed connections of the Schmitt trigger circuit will not be described since such circuits are well known to those of skill in the art. In the present case the Schmitt trigger circuit 41 merely functions to receive the signal 47 at the terminal F and produce a driving signal of constant amplitude at the output terminal 42.

The details of the integrator 39 will also not be discussed since essentially this integrator merely comprises amplifier stages which receive the signal 38 at the terminal E, provide impedance isolation from this signal and an integrating capacitor 99 and provide impedance isolating amplification devices between the capacitor 99 and the output terminal C. It should be noted that the output signal 34 is maintained at different magnitudes in response to the pulses of the constant amplitude signal 38 existing for different durations and/or different repetition rates (densities).

The threshold bias circuit 44 essentially comprises two NPN transistors 100 and 101 which have their collectors connected to the threshold bias terminals 45 and 46, respectively, with the transistors supplying appropriate voltage and/or current levels to these terminals so as to insure the proper operation of the rectifiers 37 and 40. The bases of the transistors 100 and 101 are connected together and connected to ground through the series connection of three diodes 102 connected so as to provide a three diode forward bias voltage drop as the biasing voltage for the transistors 100 and 101. The bases are coupled to B+ through a resistor 103 in series with additional forward bias diodes 104. The emitter of transistors 100 is connected to ground through a resistor 105 and the emitter of transistor 101 is connected to ground through a resistance 106 which is contemplated as being externally adjustable. It is comtemplated that diodes 70 could also serve as diodes 102 and 103.

The embodiment of the threshold bias circuit 44, as well as the embodiment illustrated for the phase splitter 35, the rectifiers 37 and 40, the Schmitt trigger 41 and the integrator 39 are contemplated as being on an integrated circuit chip, with the obvious exception of the integrating capacitor 99 and other large magnitude capacitors. Part of the resistance 106 is contemplated as being external to an integrated circuit chip, since the magnitude of this resistance is intended to be adjustable because the magnitude of this resistance will effectively determine the threshold level 43 which effectively determines the blanking threshold of the present invention.

While I have shown and described specific embodiments of the present invention, further modifications and improvements will occur to those of skill in the art. All such modifications which retain the basic underlying principles disclosed and claimed herein are within the scope of this invention.

I claim:

1. A noise blanker circuit for eliminating inpulse noise in a received information signal, comprising:
    terminal means for receiving an input signal comprising an information signal which is accompanied by background noise and noise impulses;
    noise detection means coupled to said terminal means for receiving said input signal and producing a noise detect signal related to said background noise and noise impulses but substantially independent of said information signal, said noise detect signal having peak magnitudes;
    blanking pulse generating means coupled to said noise detection means for receiving said noise detect signal and producing noise blanking pulses in response thereto; and
    controllable gate means coupled to said blanking pulse generating means and said terminal means for receiving said input signal and said noise blanking pulses and selectively passing and blocking said input signal in response to said noise blanking pulse;
    wherein the improvement comprises said blanking pulse generating means including in combination;
    noise amplifier means for receiving said noise detect signal and producing at an output terminal an amplified noise output signal, comprising amplified background noise and noise impulses, in response to said noise detect signal, said noise amplifier means substantially maintaining peak magnitudes of the amplified output signal at a first predetermined level by controlling the gain of said noise amplifier means in accordance with the average of the peak magnitudes of said noise detect signal; and
    threshold switch means for receiving said amplified output signal and producing said blanking pulses in response to said amplified output signal exceeding a second predetermined level greater in absolute magnitude than said first predetermined level;

wherein said noise amplifier means includes circuitry including rectifier means and integrator means for controlling said noise amplifier gain by producing a DC control signal which is determined by the average of the peak magnitudes of said noise detect signal and wherein said DC control signal determines the gain of said noise amplifier means, wherein occasional large magnitude noise impulses in said noise detect signal which do not substantially change the average peak magnitude of said noise detect signal will result in blanking pulses since the gain of the noise amplifier means and said control signal will not be substantially changed in response to these large magnitude noise impulses.

2. A noise blanker according to claim 1 wherein said noise amplifier means comprises negative feedback circuitry including rectifier means and integrator means coupled to said output terminal for controlling said noise amplifier gain by rectifying said amplified noise output signal and integrating said rectified noise output signal to produce said DC control signal which determines the gain of said noise amplifier means.

3. A noise blanker according to claim 2 wherein said rectifier means comprises a full wave rectifier means coupled to said output terminal for supplying the rectified noise output signal to said integrator means, said noise blanker including a comparator means which is part of said threshold switching means having one input also coupled to said full wave rectifier means for receiving said rectified noise output signal, and bias means as part of said threshold switch means for setting said second predetermined level of supplying a DC voltage to another input of said first comparator means, an output of said first comparator means determining said blanking pulses.

4. A noise blanker circuit according to claim 3 wherein said first comparator means output is coupled to said controllable gate means through a Schmitt trigger circuit.

5. A noise blanker circuit according to claim 3 wherein said negative feedback circuitry of said noise amplifier means includes a second comparator means having one input coupled to the output of said full wave rectifier means and having the output of said second comparator means coupled as an input to said integrator means, another input of said second comparator coupled to biasing means for setting said first predetermined level by providing a second DC voltage as an input to said second comparator wherein said second DC voltage is less in absolute magnitude than said first DC voltage.

6. A noise blanker circuit according to claim 5 wherein said second comparator means provides constant amplitude pulses to said integrator means and thereby minimizes the effect of random noise impulses having large magnitudes but short durations on the DC control signal produced by said integrator means.

7. A noise blanker circuit according to claim 2 wherein said negative feedback circuitry includes a splitter means having an input coupled to said output terminal for receiving said output signal and supplying in response thereto two complementary phase signals, said rectifier means in said feedback circuitry receiving both complementary phase signals and supplying an input to said integrator means, said threshold switch means including a second rectifier means which also receives said two complementary phase signals and produces a rectified output which determines said blanking pulses.

8. A noise blanker circuit according to claim 7 which includes bias means for providing first and second voltages to each of said rectifier means in said negative feedback circuitry and said threshold switching means for determining said first and second predetermined levels, respectively, said first voltage being less in absolute value than said second voltage.

9. A noise blanker circuit according to claim 8 which includes a Schmitt trigger circuit coupled between said second rectifier means and said controllable gate means.

10. A noise blanker circuit according to claim 8 wherein said rectifier means in said negative feedback circuitry and said rectifier means in said threshold switching means comprise substantially identical structure.

11. A noise blanker circuit according to claim 10 wherein said rectifier means in said negative feedback circuitry and said rectifier means in said threshold switching means each comprise differential amplifier means having two input terminals thereto, each input terminal receiving one of said phase splitter outputs, the conduction level of the differential amplifier means being determined by one of said first and second DC voltages being received by said differential amplifier means.

12. A noise blanker circuit according to claims 2, 7, 8, 9, 10 or 11, wherein said rectifier means in said negative feedback circuitry includes circuitry for providing said integrator means with an input of constant amplitude pulses representative of the rectified output of said noise amplifier means, whereby the effect on the DC control signal produced by said integrator means by random noise impulses having large mangitudes but short durations is minimized.

* * * * *